(12) United States Patent
Zhu et al.

(10) Patent No.: US 7,098,477 B2
(45) Date of Patent: Aug. 29, 2006

(54) STRUCTURE AND METHOD OF MANUFACTURING A FINFET DEVICE HAVING STACKED FINS

(75) Inventors: Huilong Zhu, Poughkeepsie, NY (US); Bruce B. Doris, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 10/709,248

(22) Filed: Apr. 23, 2004

(65) Prior Publication Data

US 2005/0239242 A1   Oct. 27, 2005

(51) Int. Cl.
*H01L 29/036* (2006.01)

(52) U.S. Cl. .................. 257/66; 257/E25.011

(58) Field of Classification Search .................. 257/66, 257/E25.011
See application file for complete search history.

(56) References Cited

U.S. PATENT DOCUMENTS

| | | | |
|---|---|---|---|
| 6,300,182 B1 | 10/2001 | Yu | |
| 6,403,434 B1 | 6/2002 | Yu | |
| 6,413,802 B1 * | 7/2002 | Hu et al. ................... | 438/151 |
| 6,433,609 B1 | 8/2002 | Voldman | |
| 6,451,656 B1 | 9/2002 | Yu et al. | |
| 6,475,869 B1 | 11/2002 | Yu | |
| 6,475,890 B1 | 11/2002 | Yu | |
| 6,492,212 B1 | 12/2002 | Ieong et al. | |
| 6,521,502 B1 | 2/2003 | Yu | |
| 6,525,403 B1 | 2/2003 | Inaba et al. | |
| 6,562,665 B1 | 5/2003 | Yu | |
| 6,580,137 B1 | 6/2003 | Parke | |
| 6,583,469 B1 | 6/2003 | Fried et al. | |
| 6,605,514 B1 | 8/2003 | Tobery et al. | |
| 6,610,576 B1 | 8/2003 | Nowak | |
| 6,611,029 B1 | 8/2003 | Ahmed et al. | |
| 6,635,909 B1 | 10/2003 | Clark et al. | |
| 6,642,090 B1 | 11/2003 | Fried et al. | |
| 6,657,259 B1 * | 12/2003 | Fried et al. ................. | 257/350 |
| 6,894,337 B1 * | 5/2005 | Wang et al. ................ | 257/302 |
| 6,921,700 B1 * | 7/2005 | Orlowski et al. ........... | 438/283 |
| 6,967,351 B1 * | 11/2005 | Fried et al. .................. | 257/74 |
| 6,995,456 B1 * | 2/2006 | Nowak ....................... | 257/627 |
| 2003/0085424 A1 | 5/2003 | Bryant et al. | |
| 2003/0102518 A1 | 6/2003 | Fried et al. | |
| 2003/0201500 A1 | 10/2003 | Furukawa et al. | |
| 2004/0110331 A1 * | 6/2004 | Yeo et al. ................... | 438/199 |

(Continued)

*Primary Examiner*—Chandra Chaudhari
*Assistant Examiner*—Matthew W. Such
(74) *Attorney, Agent, or Firm*—Mark Bilak; Joseph P. Abate (57) ABSTRACT

The present invention provides a device structure and method of forming a finFet device having stacked fins. The method of the present invention comprises: providing a substrate with a first semiconductor layer on a first insulator layer, a second insulator layer on the first semiconductor layer, and a second semiconductor layer on the second insulator layer; forming a first fin and a second fin in the second semiconductor layer; masking the first fin; and forming a third fin in the first semiconductor layer, where the second fin is stacked on the third fin. The structure of the present invention comprises: a semiconductor substrate having a first semiconductor layer on a first insulator layer, a second insulator layer on the first semiconductor layer, and a second semiconductor layer on the second insulator layer; a first and second fin formed in the second semiconductor layer; and a third fin formed in the first semiconductor layer, where the second fin is stacked on the third fin.

11 Claims, 9 Drawing Sheets

U.S. PATENT DOCUMENTS

2004/0219722 A1* 11/2004 Pham et al. ................. 438/157
2005/0106789 A1* 5/2005 Gottsche et al. ............ 438/163
2005/0224797 A1* 10/2005 Ko et al. ...................... 257/64

* cited by examiner

STRUCTURE AND METHOD OF MANUFACTURING A FINFET DEVICE HAVING STACKED FINS

BACKGROUND OF INVENTION

1. Technical Field

The present invention relates generally to the field of semiconductor processing and, more specifically, to finFET CMOS devices.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in complementary metal oxide semiconductor (CMOS) technologies such as in the design and fabrication of field effect transistors (FETs). FETs are the basic electrical devices of today's integrated circuits and are used in almost all types of integrated circuit design (e.g., microprocessors, memory, etc.). FETs may be formed on conventional substrates. For example, a conventional CMOS FET formed on a silicon wafer may include a gate oxide layer formed on the wafer, a gate formed on the gate oxide layer, spacers formed beside the gate on the gate oxide layer, and doped source/drain (S/D) regions arranged on respective sides of a gate conductor. The gate is separated from a channel (which is situated between the S/D regions) by the gate oxide layer. Shallow trench insulator (STI), local oxidation of silicon (LOCOS), or poly-bared LOCOS isolations are usually employed to provide for isolation of adjacent transistors. When the FET is operated, an electric field is grated by applying a voltage to the gate. The electrical field is used to control the channel situated between the S/D regions. For example, if the channel is turned on, the electrons/holes flow from the source region to the drain region. In contrast, if the channel is turned off the electrons/holes cannot flow between the source region and the drain region. Therefore, the on/off state of the channel controls the connection/disconnection of the circuit.

Unfortunately, increased device density in CMOS technologies often results in degradation of reliability. One type of FET that has been proposed to facilitate increased device density is a double gated FET (finFET). FinFETs use two gates, one on each side of a fin body (i.e. transistor body), to facilitate scaling of CMOS dimensions, while maintaining an acceptable performance. In particular, the use of the double gate suppresses Short Channel Effects (SCE), provides for lower leakage, and provides for more ideal switching behavior. In addition, the use of the double gate increases gate area, which allows the finFET to have better current control, without increasing the gate length of the device. As such, the finFET is able to have the current control of a larger transistor without requiring the device space of the larger transistor. However, conventional fin height control techniques have drawbacks that introduce undesirable variation into the height of fins. For example, conventional non-silicon-on-insulator finFET technologies rely on a silicon etch-stop height control technique for determining fin height. This technique involves the process of etching fins from silicon where the silicon fins have different heights. The height of a fin is determined by how much bulk silicon is etched. Variability in the etch depth translates to undesirable variability in fin height. Such a technique introduces too much variation into the manufacture of variable height fins because the etch process is difficult to precisely control.

Another way to facilitate scaling of CMOS dimensions, while maintaining an acceptable performance, is to increase the mobility of carriers in a semiconductor material. In CMOS technology, n-channel FETs (n-FETs) use electrons as carriers and p-channel FETs (p-FETs) use holes as carriers. When an electric field is applied to a semiconductor substrate, each of the carriers (i.e. holes and electrons) in the substrate will experience a force from the field and will be accelerated along the field. The velocity of the carriers due to this effect is called drift velocity and it is proportional to the applied electric field. This proportionality factor is known as mobility ($\mu$). The higher the mobility, the higher the current density the transistor will have, resulting in a faster switching speed.

In conventional CMOS technologies, mobility of carriers is dependent on a number of factors, especially the surface plane of a wafer. That is, carriers see the periodicity of the atoms (the pattern the atoms form), which is completely determined by the crystal plane. Thus, planar devices always have the mobility associated with the plane on which they are formed.

Accordingly, conventional CMOS technologies use silicon substrates having a surface oriented on a (100) crystal plane. Conventional silicon substrates having a surface oriented on the (100) crystal plane are chosen because: (a) the surface state density between the silicon substrate and the silicon oxide film is at a minimum when the silicon substrate surface is oriented on the (100) plane; and (b) the mobility of electrons in the (100) plane is higher than in other crystal planes, and therefore, the source-drain current of a n-channel FET formed on the semiconductor substrate having the (100) plane provides the largest current. However, the mobility of holes is not optimized in the (100) plane, and therefore, the source-drain current of a p-channel FET formed on the semiconductor substrate having the (100) plane is inevitably small. The p-channel FET therefore fails to have desirable characteristics, even though the n-channel FET exhibits good characteristics. Many planes in a lattice are equivalent by a symmetry transformation. For example, the (100), (010), and (001) planes are planes of equivalent symmetry. In this application, a plane and all of its equivalent planes are denoted by { } parentheses. Thus, the designation of the plane {100} includes the equivalent (100), (010), and (001) planes. Like the crystal direction, a crystal plane in this application includes both positive and negative integers unless specifically stated or shown otherwise. Accordingly, for example, the designation of the plane {100} includes the (−100), (0−10), and (00−1) planes in addition to the (100), (010), and (001) planes.

Hole mobility could be enhanced, especially at high electric fields, if p-channel FETs were formed on the (111) plane. However, because the (111) plane has a worse mobility for electrons, it is not used in conventional planar CMOS. In conventional planar CMOS, since utilizing different planes for different devices is impossible (i.e. since planar CMOS is "planar", both n-channel FETs and p-channel FETs must be on the same plane), the (100) plane provides a compromise between maximizing hole and electron mobility.

Conventional finFET technologies have drawbacks regarding hole mobility. For example, due to mobility differences between electrons and holes in silicon, conventional finFET technologies require the number of p-finFET devices to be approximately twice that of n-finFET devices so to obtain the same electrical current when p-finFET height is the same as n-finFET height. Thus, the total area required for p-finFET devices is approximately twice that of n-finFET devices. Alternatively, conventional techniques for accommodating mobility differences rely on the fabrication of multiple parallel fins on a substrate. This technique has an undesirable circuit density penalty. By fabricating parallel fins for a single device to accommodate mobility differences, one problem is created (more substrate area is consumed per device) while addressing another (mobility differences).

Thus, there is a need for improved finFET technologies that: improve circuit density by forming finFET devices from single fin n-finFETs and from stacked fin p-finFETs without impacting device performance; utilize various crystal planes for FET current channels in order to optimize mobility and/or reduce mobility in specific devices depending upon the particular application; and improve fin height control by forming finFETs from multiple silicon layers having buried oxide layers in between the silicon layers, thus eliminating the need for a silicon etch-stop height control technique.

SUMMARY OF INVENTION

The present invention thus provides a device structure and method of forming fin Field Effect Transistors (finFETs) that overcome many of the disadvantages of the prior art. Specifically, the device structure and method provide the ability to form finFET devices with improved circuit density while accounting for mobility differences by forming a finFET device having a single fin n-finFET and a stacked double fin p-finFET. Additionally, the device structure and method provide the ability to form finFET devices that utilize various crystal planes in order to optimize mobility and/or reduce mobility in specific devices. Finally, the device structure and method provide improved fin height control by forming finFETs from multiple silicon layers having buried oxide layers in between the silicon layers, the buried oxide layers acting as a silicon etch stop.

In a first aspect, the invention is a method of forming a semiconductor structure, the method comprising the steps of providing a substrate with a first semiconductor layer on a first insulator layer, a second insulator layer on the first semiconductor layer, and a second semiconductor layer on the second insulator layer, forming a first fin and a second fin in the second semiconductor layer, masking the first fin, and forming a third fin in the first semiconductor layer, where the second fin is stacked on the third fin.

In a second aspect, the invention is a semiconductor structure comprising a semiconductor substrate having a first semiconductor layer on a first insulator layer, a second insulator layer on the first semiconductor layer, and a second semiconductor layer on the second insulator layer, a first and second fin formed in the second semiconductor layer, and a third fin formed in the first semiconductor layer, where the second fin is stacked on the third fin.

In a third aspect, the invention is the semiconductor structure as previously described, where the first silicon layer has a surface oriented on a first crystal plane and the second silicon layer has a surface oriented on a second crystal plane.

In a fourth aspect of the invention, the invention is a finFET device comprising the semiconductor structure as previously described, further comprising a dopant implanted into each of the fins, a gate stack formed on each of the fins, a source region implanted in a first exposed portion of each of the fins, and a drain region implanted in a second exposed portion of each of the fins, where the source and drain regions are separated by the fin channel region.

The foregoing and other advantages and features of the invention will be apparent from the following more particular description of a preferred embodiment of the invention and as illustrated in the accompanying drawings.

BRIEF DESCRIPTION OF DRAWINGS

The preferred exemplary embodiment of the present invention will hereinafter be described in conjunction with the appended drawings, where like designations denote like elements.

DETAILED DESCRIPTION

The present invention thus provides a device structure and method of forming fin Field Effect Transistors (finFETs) that overcome many of the disadvantages of the prior art. Specifically, the device structure and method provide the ability to form finFET devices with improved circuit density while accounting for mobility differences by forming a finFET device with a single fin n-finFET and a stacked double fin p-finFET. Additionally, the device structure and method provide the ability to form finFET devices that utilize various crystal planes in order to optimize mobility and/or reduce mobility in specific devices. Finally, the device structure and method provide improved fin height control by forming finFETs from multiple silicon layers having buried oxide layers in between the silicon layers, the buried oxide layers acting as a silicon etch stop.

The invention will next be illustrated with reference to the figures in which the same numbers indicate the same elements in all figures. Such figures are intended to be illustrative, rather than limiting, and are included to facilitate the explanation of the process and device of the present invention.

Figure 1:
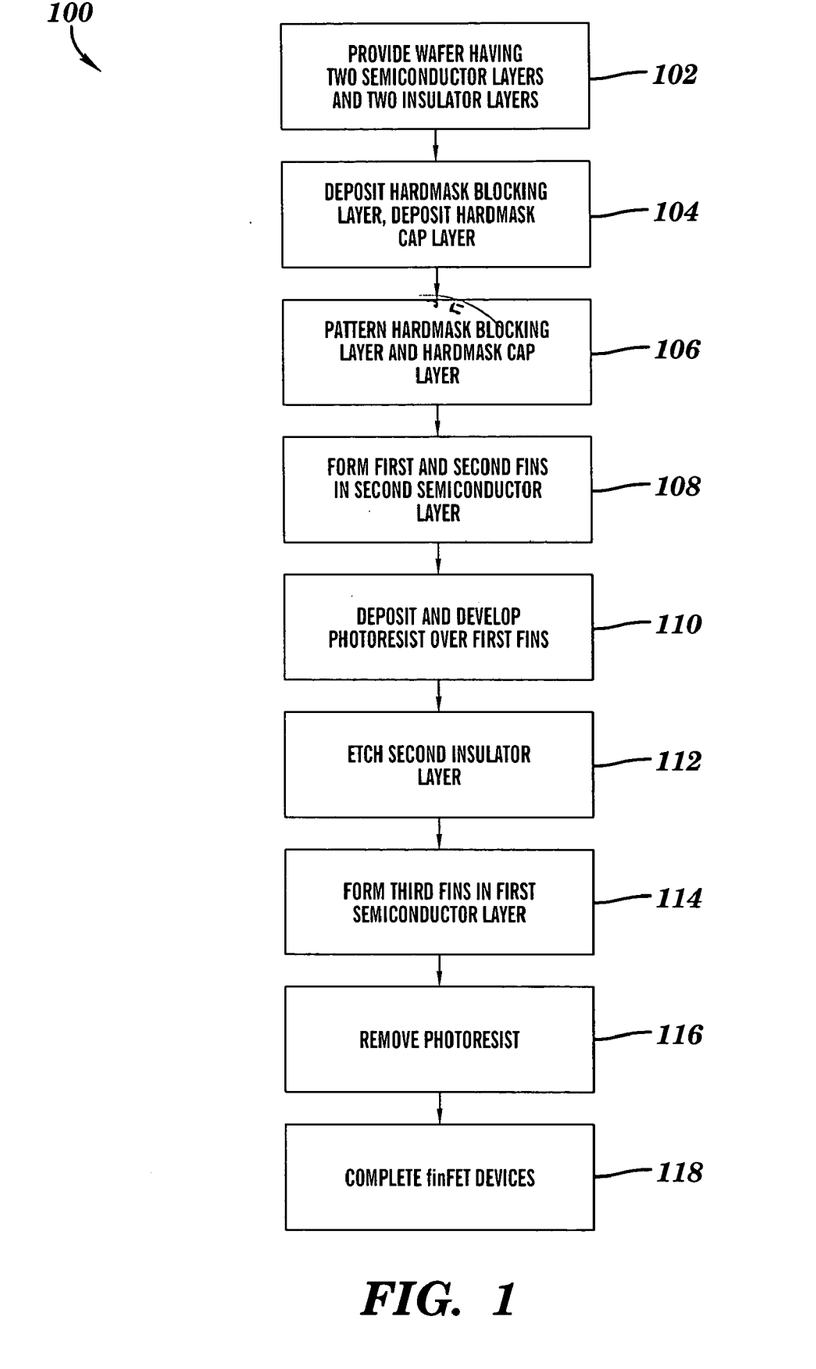
FIG. 1 is a flow diagram illustrating a fabrication method of the invention.

Turning now to FIG. 1, an exemplary method 100 for forming finFETs in accordance with the present invention is illustrated. The fabrication method 100 allows finFETs to be formed with improved circuit density, height control, and mobility enhancements. Thus, method 100 provides the advantages of producing finFETs in a more cost-effective fabrication process. Method 100 will now be described in detail, along with examples of one embodiment of a wafer portion during process in FIGS. 2–9.

The first step 102 of FIG. 1, is to provide a suitable semiconductor substrate that includes two semiconductor layers and two insulator layers, where each semiconductor layer has an insulator layer beneath it and in contact with it. In the preferred embodiment, the semiconductor layers comprise silicon and the insulator layers comprise silicon dioxide. Alternatively, the semiconductor layers may comprise any suitable semiconductor material. The silicon layers of the preferred embodiment are herein referenced to as Silicon-on-Insulator (SOI) layers and the insulator layers as Buried Oxide (BOX) layers.

Figure 2:
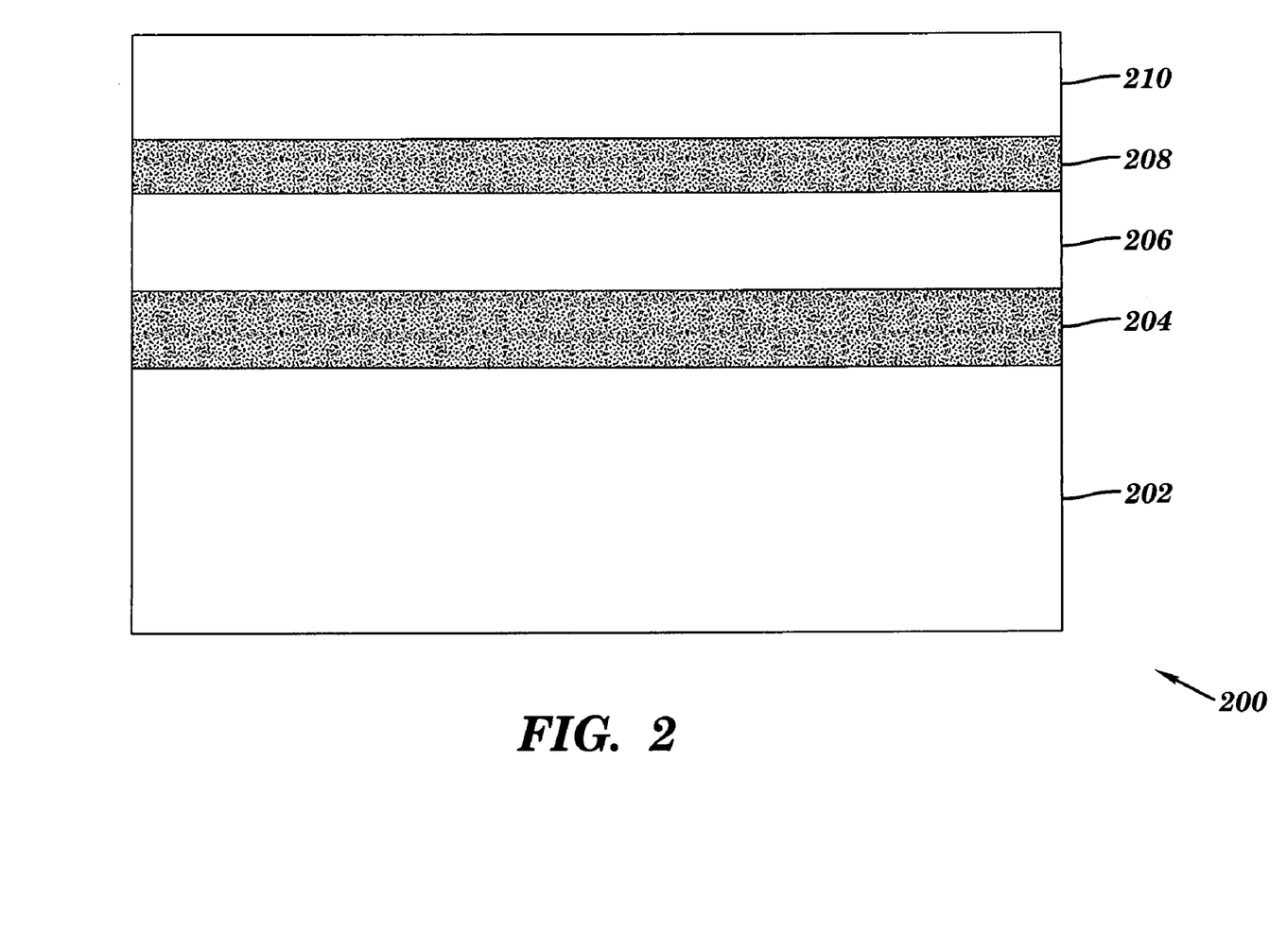
FIGS. 2–9 are cross-sectional side views of an embodiment of a semiconductor structure of the invention during the fabrication method of FIG. 1.

Turning now to FIG. 2, an exemplary semiconductor structure 200 is illustrated that comprises a semiconductor substrate 202, a first BOX layer 204, a first SOI layer 206, a second BOX layer 208 and a second SOI layer 210. First BOX layer 204 and first SOI layer 206 can be formed by implanting oxygen into substrate 202. The formation of a SOI layer and a BOX layer in a semiconductor substrate by implantation of oxygen, known as Separation by IMplanted OXygen (SIMOX), is well known in the art, and thus, is not described in further detail. First BOX layer 204 and first SOI layer 206 can be any suitable thickness. For example, first BOX layer 204 can be approximately 100 nm to 200 nm thick and first SOI layer 206 can be approximately 40 nm to 70 nm thick. Substrate 202 can comprise any suitable bulk semiconductor material, such as a silicon {100} wafer. For example, substrate 202 can comprise any suitable bulk semiconductor material having a surface oriented on a first crystal plane that enables subsequent crystal planes for FET current channels to be utilized, such as a {110} crystal plane for example. The proper alignment of the crystal lattice has a large effect on the material properties of the substrate, including its electrical properties (e.g. its carrier mobility properties) and how it reacts to other materials and chemical processing. As will be made clear, providing a substrate having a surface oriented on a {110} crystal plane for example enables method 100 to form finFETs in a manner that enables subsequent crystal planes for the FET current channels to be utilized.

Second BOX layer 208 can be formed by depositing a dielectric film onto first SOI layer 206. Second BOX layer 208 can comprise any suitable material and be any suitable thickness. For example, second BOX layer 208 can comprise approximately 10 nm to 30 nm of silicon dioxide. Second SOI layer 210 can be formed by bonding a second bulk semiconductor wafer to the surface of second BOX layer 208, where the second bulk wafer comprises implanted hydrogen. For example, the second bulk wafer can be bonded to the second box layer 208 by placing the second bulk wafer in contact with the surface of second BOX layer 208 at a temperature ranging from room temperature to 1000 C. The implanted hydrogen causes the silicon bonds of the second bulk wafer to cleave at a substantially uniform plane at some depth in the bulk semiconductor wafer, where the depth is determined by the implant energy of the hydrogen. Second SOI layer 210 is formed by cleaving the second bulk wafer along a substantially uniform plane formed by the implanted hydrogen. After cleaving the second bulk wafer, second SOI layer 210 remains bonded to the surface of second BOX layer 208. Second SOI layer can be any suitable thickness. For example, second SOI layer 210 can be approximately 40 nm to 70 nm thick.

The second bulk wafer can comprise any suitable bulk semiconductor material. For example, the wafer can comprise any suitable bulk semiconductor material having a surface oriented on a second crystal plane such as a {100} crystal plane for example. The particular finFET plane (the crystal plane that the electrons or holes are associated with) is defined by the sidewall of the fin, as opposed to the particular crystal plane the SOI layer is oriented on. The predetermined orientation of first SOI layer 206 will result in fin sidewalls being oriented on a first crystal plane while the predetermined orientation of second SOI layer 210 will result in fin sidewalls being orientated on a second crystal plane. Accordingly, fin sidewalls that will be formed from first SOI layer 206 may be oriented on a first crystal plane (e.g. a {110} crystal plane) that provides different carrier mobility as compared to fins that will be formed on second SOI layer 210 having a second crystal plane (e.g. a {100} crystal plane). Alternatively, first SOI layer 206 and second SOI layer 210 may have the same crystal orientation, and therefore, provide the same carrier mobility.

Returning to FIG. 1, the next step 104 of method 100 is to deposit a suitable hardmask blocking layer and a suitable hardmask cap layer. Both the hardmask blocking layer and the hardmask cap layer can comprise any suitable material and any suitable thickness. For example, the hardmask blocking layer can comprise approximately 15 Å to 100 Å of silicon dioxide, and the hardmask cap layer can comprise approximately 200 Å to 300 Å of silicon nitride. As will become clear, the hardmask cap layer and the hardmask blocking layer will be used to pattern the fins.

Figure 3:
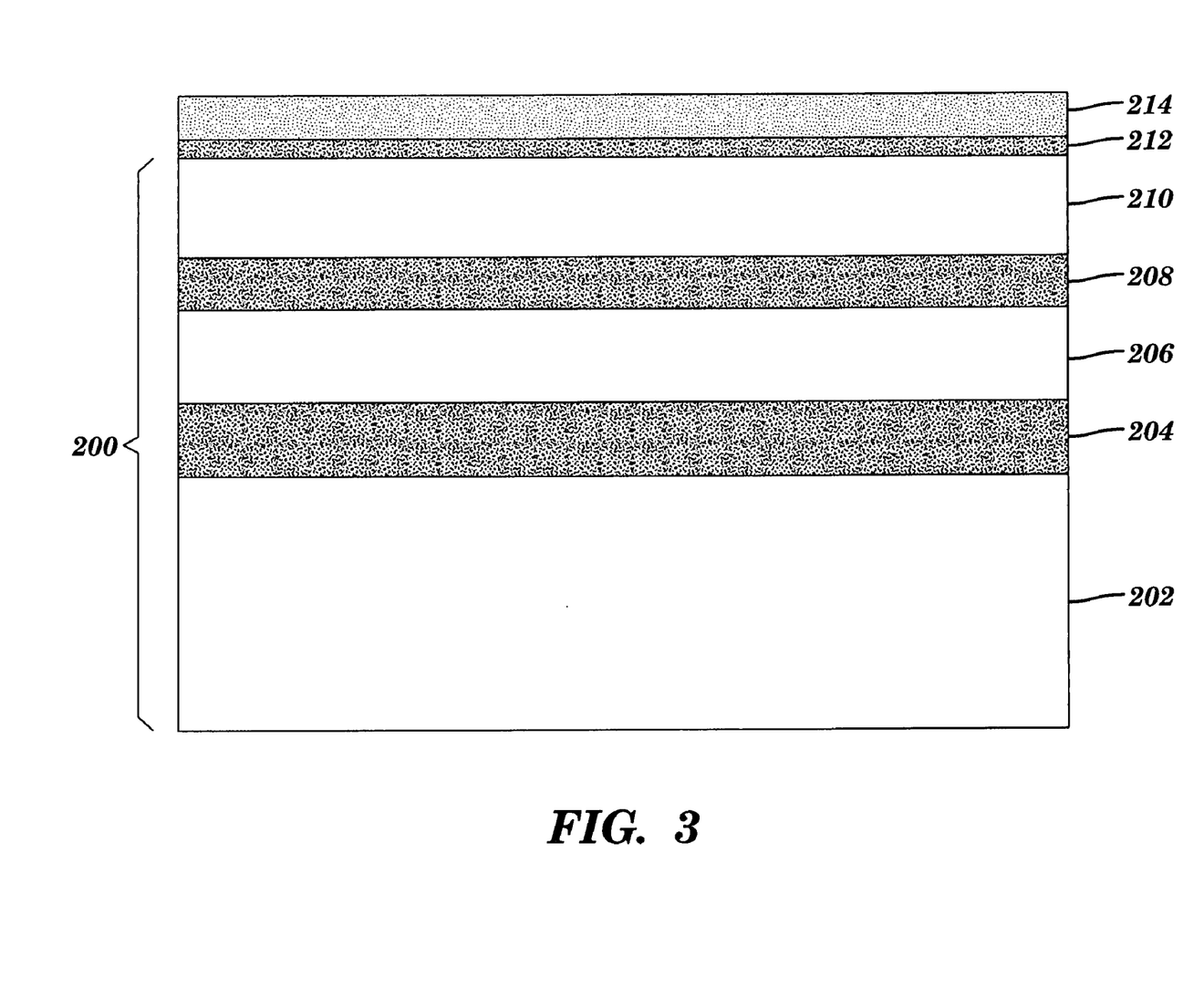

Turning now to FIG. 3, semiconductor structure 200 is illustrated after hardmask blocking layer 212 and a hardmask cap layer 214 have been deposited. Hardmask blocking layer 212 and hardmask cap layer 214 can comprise any suitable hardmask material, such as silicon dioxide and silicon nitride, respectively.

Returning to FIG. 1, the next step 106 is to pattern the hardmask blocking layer and the hardmask cap layer to form the fin patterns. This can be done using any suitable process, and would typically involve the deposition and developing of a suitable photoresist and then a subsequent etch of the hardmask blocking layer and hardmask cap layer. The photoresist can be developed using any suitable process such as optical lithography, electron beam lithography, x-ray lithography, or other conventional means for developing the photoresist. After the photoresist has been developed, the hardmask blocking layer and hardmask cap layer can then be patterned selective to the developed photoresist with a reactive ion etch (RIE). The patterned hardmask layers will then be used to pattern the underlying second SOI layer during a silicon RIE to define first silicon fins that will be used to form n-finFET devices and second silicon fins that will be used to form stacked-fin p-finFET devices. As such, the length and height of the patterning would be determined by the desired fin sizes for the particular application.

Figure 4:
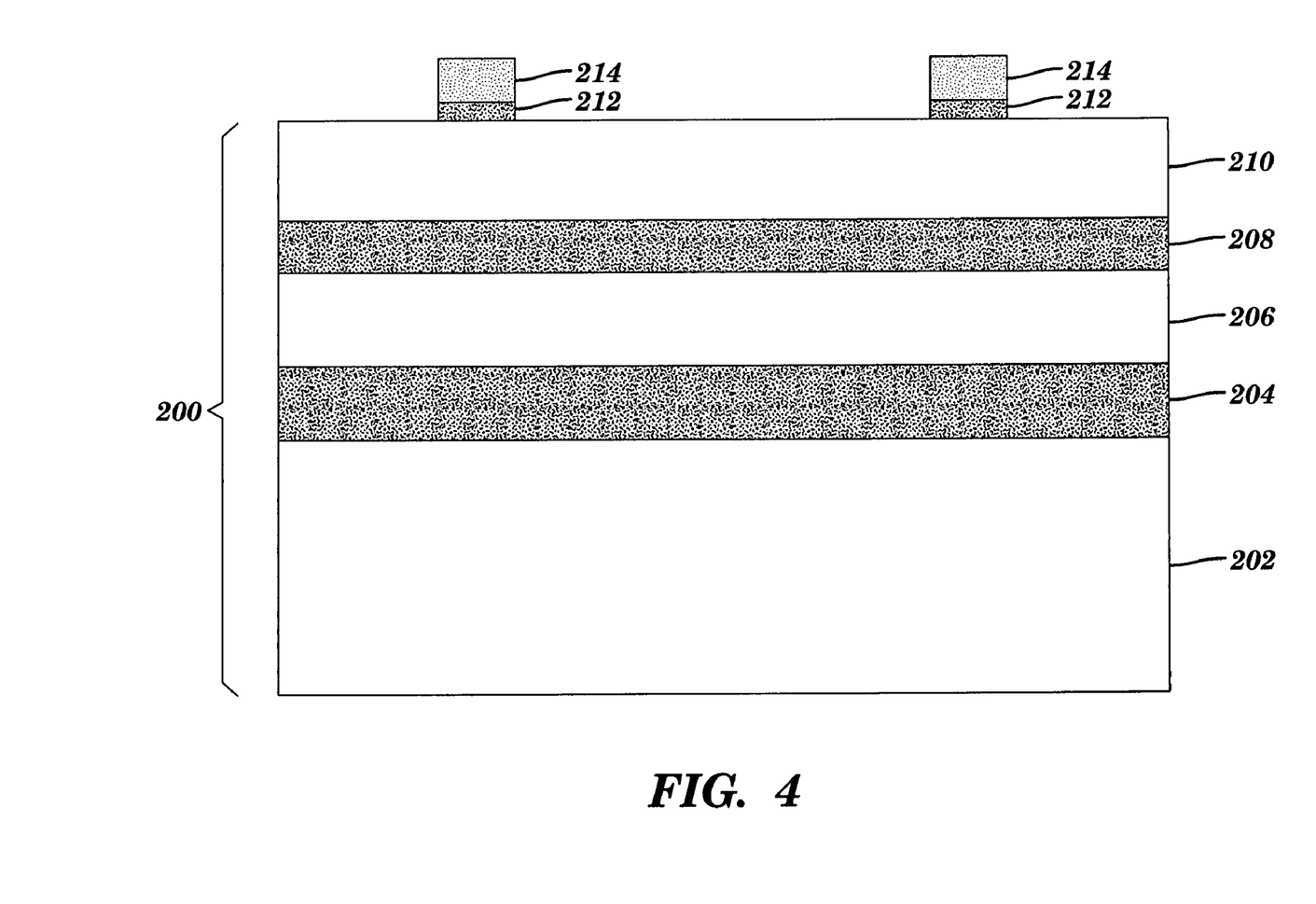

Turning now to FIG. 4, semiconductor structure 200 is illustrated after the hardmask blocking layer 212 and the hardmask cap layer 214 have been patterned.

Returning to FIG. 1, the next step 108 is to form first fins that will be used to form n-finFET devices and second fins that will be used to form stacked-fin p-finFET devices. The patterned hardmask layers are used to pattern the underlying second SOI layer during a silicon RIE to define the first and second fins. The silicon RIE process stops when the second BOX layer is reached, and thus, the second BOX layer functions as a silicon etch stop.

Figure 5:
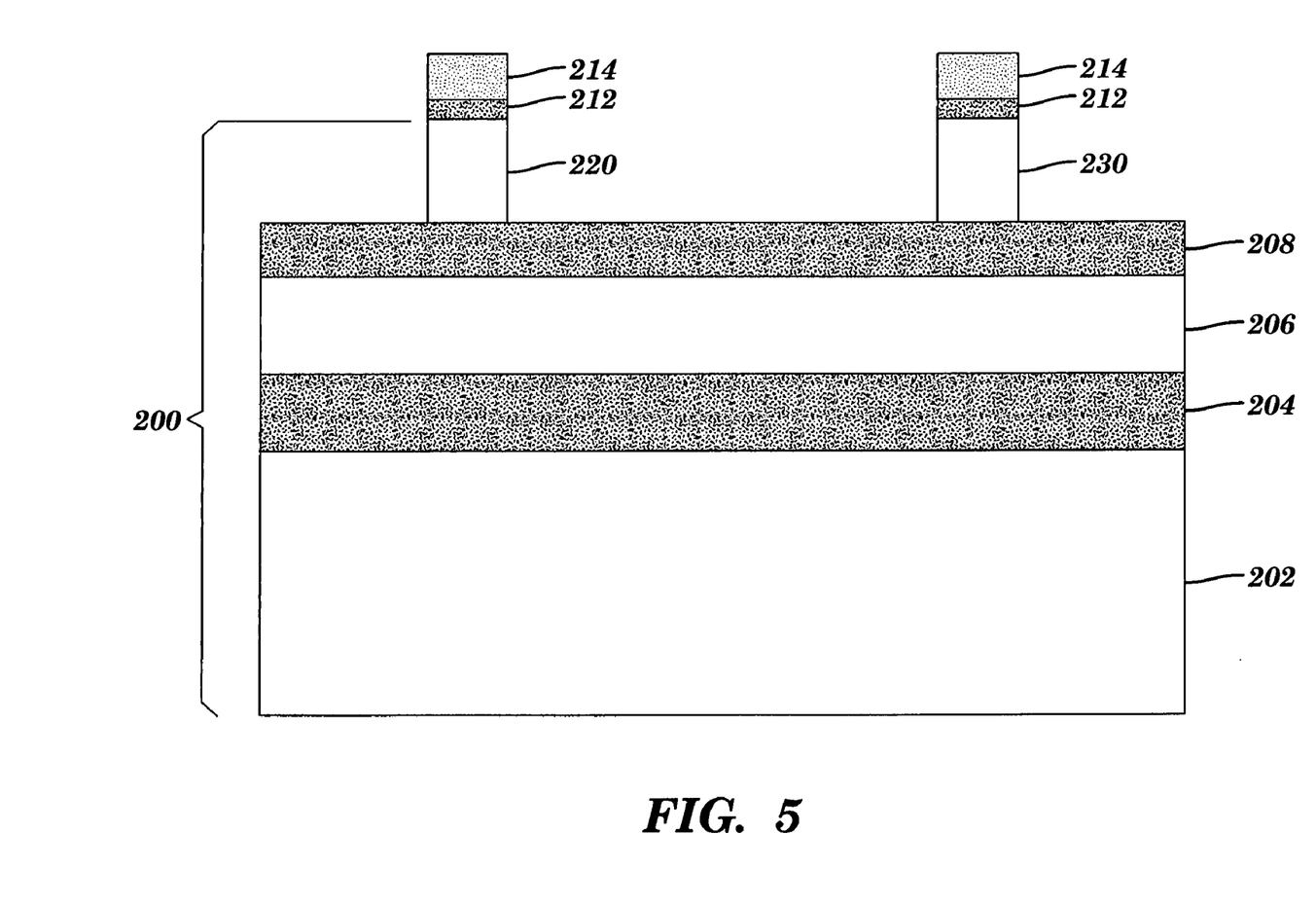

Turning now to FIG. 5, semiconductor structure 200 is illustrated after the second SOI layer has been etched. At this point, the portions of the second SOI layers that were not etched form first fins 220 and second fins 230. The height of fins 220 and 230 is predetermined by the thickness of the second SOI layer. As previously stated, the thickness of the second SOI layer can be approximately 40 nm to 70 nm.

Returning to FIG. 1, the next step 110 is to deposit and develop a suitable photoresist over the first fins so that only the first fins will be protected, also known as masked, during subsequent processing steps. The second fins that will be used to form stacked-fin p-finFET devices remain exposed. As will become clear, the first fins that will be used to form n-finFET devices are covered by developed photoresist so that the fins are masked when the first BOX layer and the first SOI layer are etched to form the stacked double fins.

Figure 6:
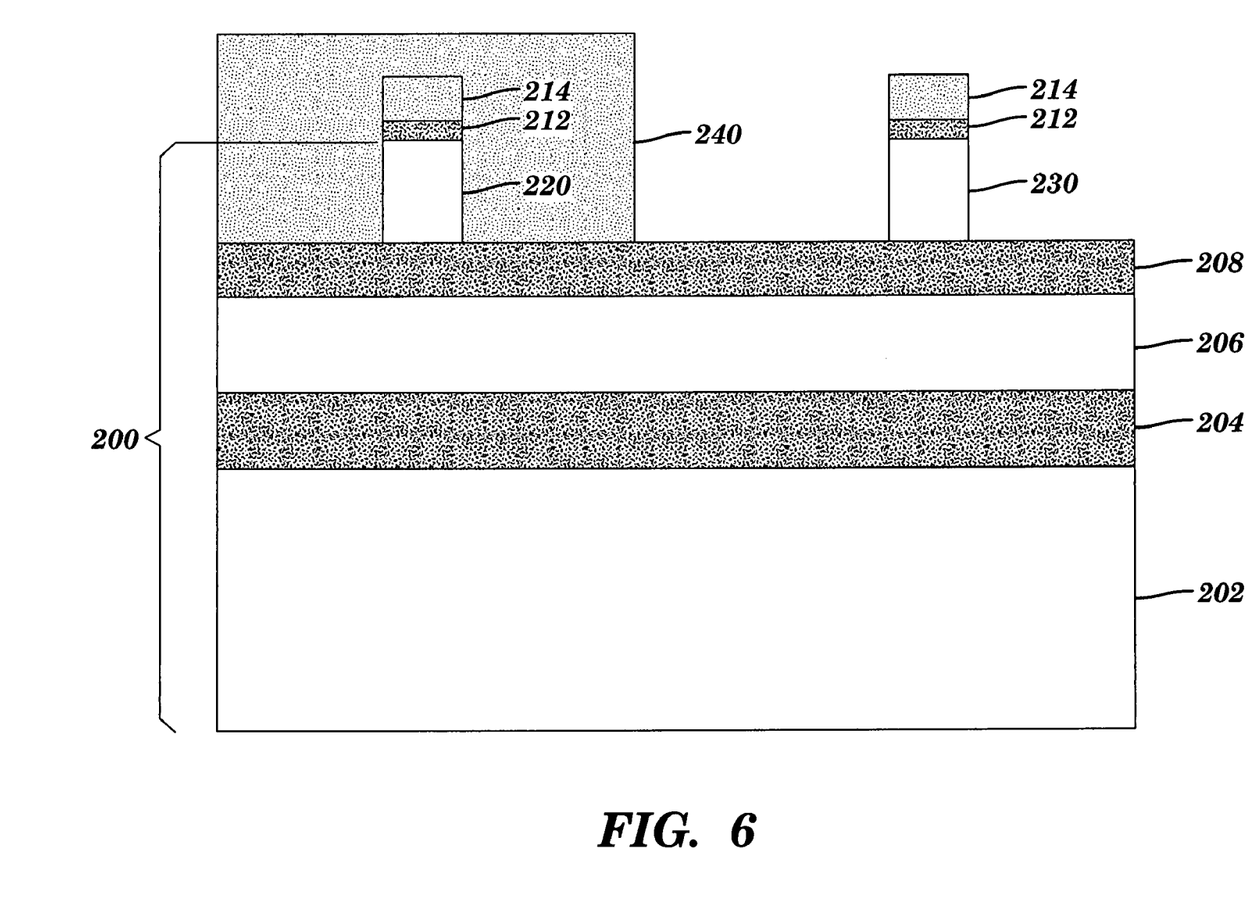

Turning now to FIG. 6, semiconductor structure 200 is illustrated after photoresist 240 has been deposited and developed over first fins 220. Second fins 230 that will be used to form stacked-fin p-finFET devices remain exposed.

Returning to FIG. 1, the next step 112 is to etch the exposed area of the second BOX layer. The exposed area of the second BOX layer is the portion of that layer not covered by the photoresist patterned during step 110 and not positioned under the hardmask blocking layer and hardmask cap layer patterned during step 106. After the oxide RIE, the next step 114 is to etch the exposed area of the first SOI layer to form the third fins. The exposed area of the first SOI layer is that portion of the first SOI layer that was covered by the portion of the second BOX layer which was removed during etch step 112. The silicon RIE process is continued until the first BOX layer is reached.

Figure 7:
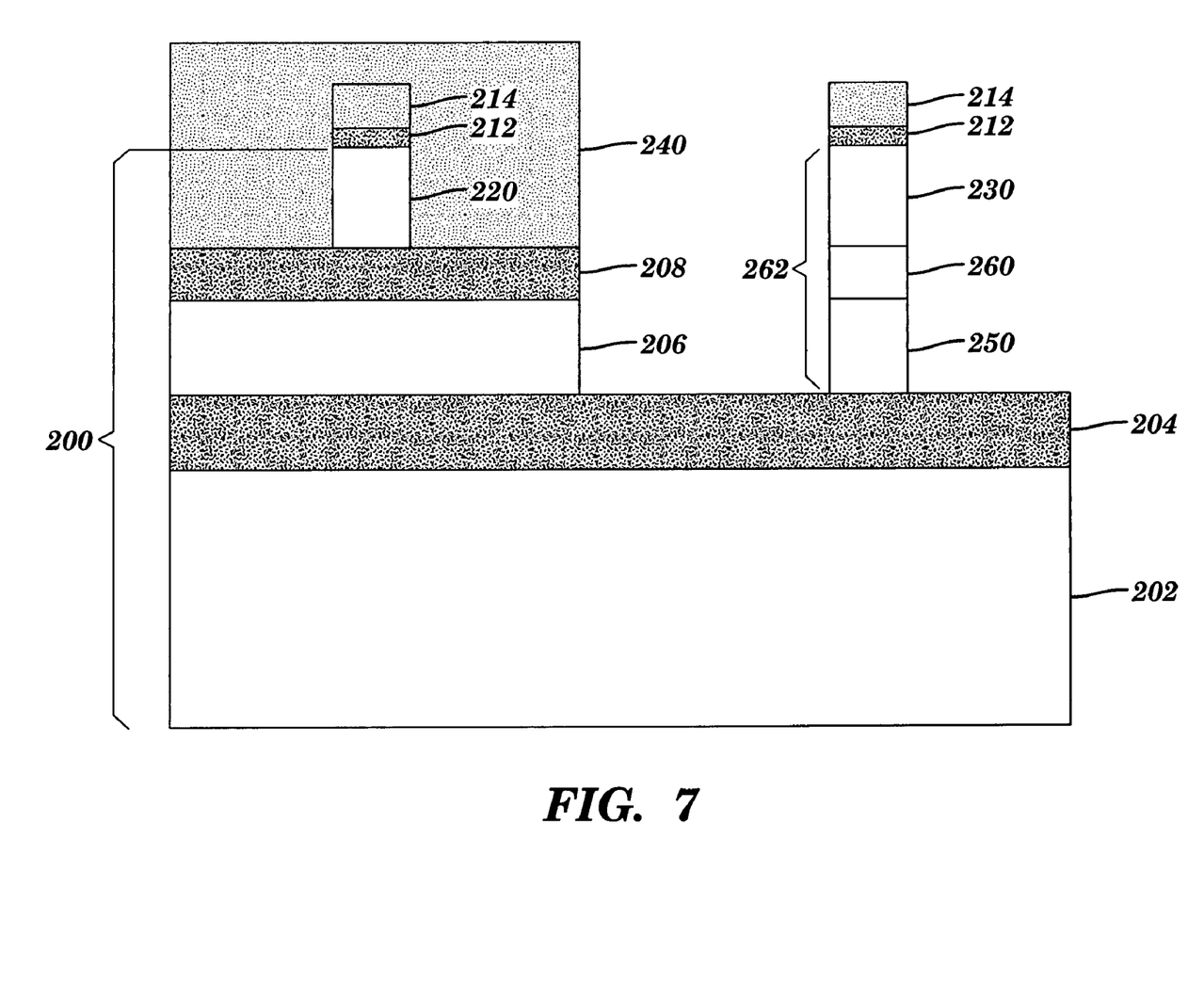

Turning now to FIG. 7, semiconductor structure 200 is illustrated after second BOX layer 208 and first SOI layer 206 have both been etched in accordance with steps 112 and 114 of FIG. 1, respectively. First fins 220 that will be used to form n-finFET devices have not been affected by etching steps 112 and 114 of FIG. 1 due to developed photoresist 240. Third fins 250 of stacked double fins 262 (formed by second fins 230 and third fins 250) have been formed as a result of etching steps 112 and 114 of FIG. 1. The height of third fins 250 is predetermined by the thickness of first SOI layer 206. As previously stated, the thickness of the first SOI layer can be approximately 40 nm to 70 nm. Oxide layer 260 separates second fins 230 from third fins 250 of stacked double fins 262. Therefore, p-finFET devices to be formed from stacked double fins 262 will have substantially the same current density as n-finFET devices to be formed from first fins 220 because the p-finFET devices will have twice the surface area (second fins 230 and third fins 250) as the n-finFET devices (first fins 220), thus adjusting for the reduced carrier mobility of p-finFET devices. Additionally, BOX layers 204 and 208 act as an ideal silicon etch stop, thus, the height of fins 220, 230 and 250 is well controlled.

Returning to FIG. 1, the next step 116 is to remove the photoresist that was deposited and patterned during step 110. The photoresist can be removed using any suitable technique, for example a liquid resist strip process or an oxygen plasma process where the photoresist is oxidized (commonly referred to as ashing). The underlying hardmask blocking layer and hardmask cap layer can remain, and can be used to protect the fins during future processes.

Figure 8:
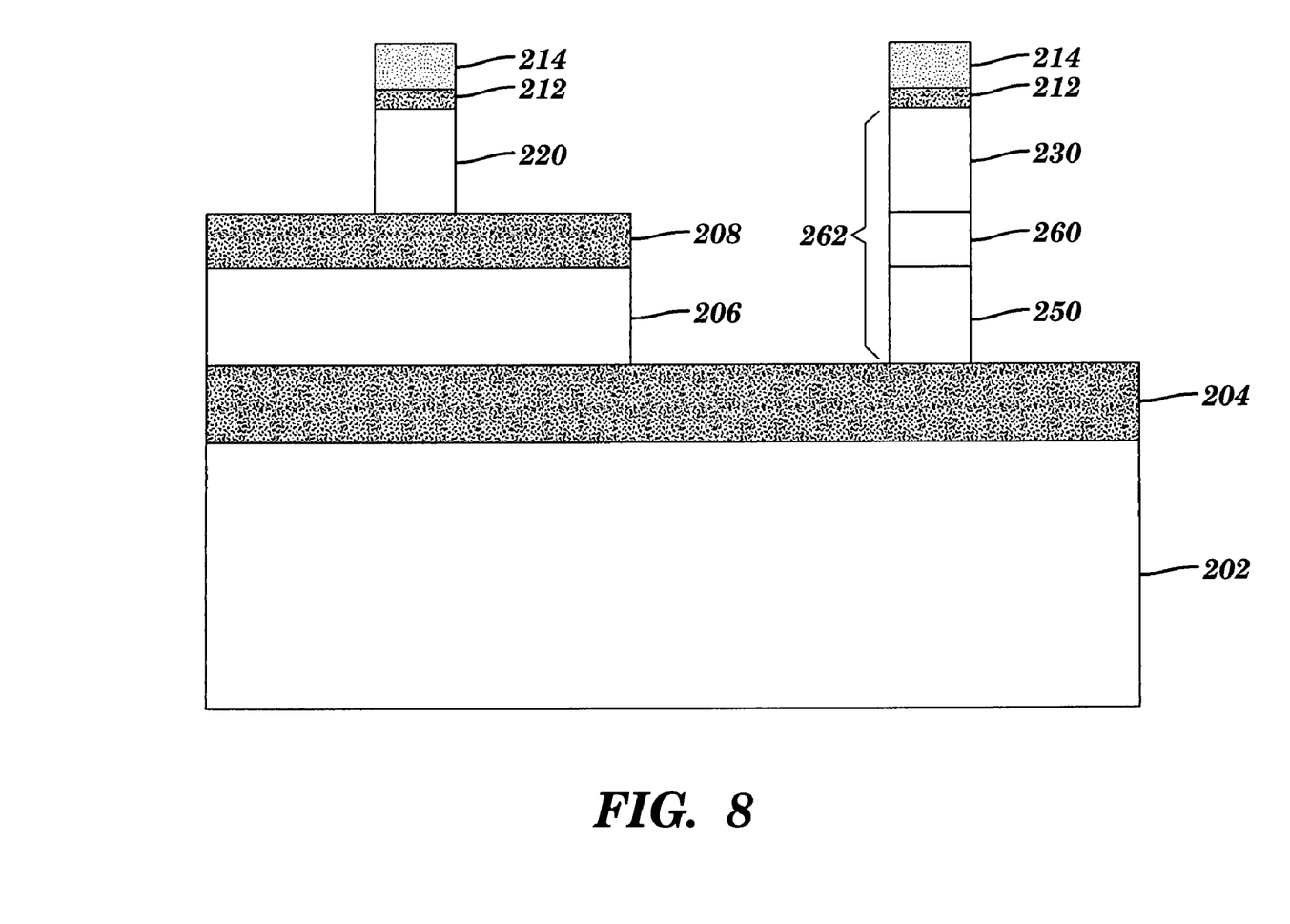

Turning now to FIG. 8, first fins 220 can be used to form n-finFET devices and stacked double fins 262 can be used to form p-finFET devices. First fins 220 are positioned on second BOX layer 208, first SOI layer 206, first BOX layer 204, and semiconductor substrate 202. Second fins 230 and third fins 250, separated by oxide layer 260, are positioned on first BOX layer 204 and semiconductor substrate 202. Hardmask blocking layer 212 and hardmask cap layer 214 can remain and can be used to protect the fins during future processes.

With the fins defined, finFET devices can then be completed. The described methods can be applied to any type of finFET manufacturing process. A short description of an exemplary process will now be given, but those skilled in the art will recognize that other suitable processes could be used.

The first step in the exemplary process would be to dope the fins. Typically, this may include an ion implantation into the fins. Ion implantation is typically designed to achieve a concentration of, for example, between $1 \times 10^{17}$ cm$^{-3}$ to $5 \times 10^{18}$ cm$^{-3}$ for the purpose of adjusting threshold voltage. In one embodiment, ion implantation may comprise an angled implant into exposed opposing vertical sidewalls of semiconductor layer, and would serve to properly dope the fins.

The next steps would be to form gate stacks. This can comprise forming gate insulator layers on opposing vertical sidewalls of the fins. Gate insulator layers may be formed by thermal oxidation, typically at 750–800° C., or alternatively, may be formed by depositing a dielectric film. For the exemplary purposes of this disclosure, gate insulator layers may be $SiO_2$, a nitrided oxide material, a high-K dielectric material, or combinations thereof, as known in the art.

The next step is to form gate conductor layer overlying the gate insulator layers. Gate conductor layer may be any suitable conducting material, typically a polycrystalline silicon material, although amorphous silicon, a combination of amorphous silicon and polysilicon, polysilicon-germanium, or any other appropriate material may be used to form gate conductor layer. In addition, in some embodiments of the present invention, it might be advantageous to employ a metal gate conductor layer, such as W, Mo, or Ta, or any other refractory metal, or alternatively, a silicided gate conductor comprising polysilicon added with Ni or Co. When the gate conductor layer is a silicon material, it may be deposited as a doped layer (in-situ doping). Where the gate conductor layer is a metal layer, such layers may be deposited using physical vapor or chemical vapor deposition methods or any other technique known in the art. In this manner, gate structures are formed adjacent to oxide layers formed on opposing vertical sidewalls of the fins formed by semiconductor layer portions.

The next step is to pattern gate conductor layer and gate insulator layer. This would typically be accomplished by depositing and patterning a hardmask film. Typically, hardmask film material may be $SiO_2$ or $Si_3N_4$. Accordingly, gate conductor layer may be patterned and structured using well known photolithography and etching techniques to form the gate stack, i.e., using hardmask film caps as an etch mask during a directional etching of gate conductor layer. This involves selectively removing portions of gate conductor layer down to the isolation, but does not remove the portions of semiconductor layer forming the fins that are protected by hardmask film. Therefore, the fins may extend beyond the gate stack. The patterning and structuring also leaves portions of gate conductor layer, which define the gate structures adjacent the fin bodies.

The next step is to form a thin oxide layer on the gate conductor sidewalls, most commonly known as an oxide spacer, and then to dope the exposed portion of the fins with halo and/or extension implants. Formation of the source/drain regions may be accomplished using any of the variety of methods that have been developed to form source/drain regions and that are tailored for specific performance requirements. There are many such methods for forming source/drain regions having various levels of complexity. Thus, in some embodiments of the present invention, using ion implantation for example, lightly doped source/drain regions or other source/drain regions may be formed. Thus, for NFETs, typically P, As, or Sb for example is used for the source/drain implants in the range of 1 to 5 keV and a dose of $5 \times 10^{14}$ to $4 \times 10^{15}$ cm$^{-3}$. Similarly, for PFETs, typically B, In, or Ga for example is used for the source/drain implants in the range of 0.5 to 3 keV and dose of $5 \times 10^{14}$ to $4 \times 10^{15}$ cm$^{-3}$.

Optionally, extension and halo implants may be formed that improve Short Channel Effects (SCE). For NFETs, typically B, In, or Ga may be used for the halo implants with energies in the range of 5 to 15 keV and a dose of $1 \times 10^{13}$ to $8 \times 10^{13}$ cm$^{-3}$. Similarly, for PFETs, P, As, or Sb may be used for the halos, with energies from 20 to 45 keV and dose of $1 \times 10^{13}$ to $8 \times 10^{13}$ cm$^{-3}$.

To complete the devices, contacts to sources, drains, and gates may then be formed. Accordingly, a dielectric may be deposited and planarized typically using a CMP process. Contact holes may then be structured and etched using an anisotropic process (e.g. RIE) or the like. The contact holes may be filled using any conducting material, such as doped polysilicon, silicide (e.g. WSi), metals (e.g. Au, Al, Mo, W, Ta, Ti, Cu, or ITO (indium-tin oxide)), or the like, being deposited by evaporation, sputtering, or other known techniques, thereby forming S/D contacts. Then the first metal layer may be deposited and structured using a RIE process or the like. Alternatively, the structuring of the first metal layer may be done following a damascene process flow.

Figure 9:
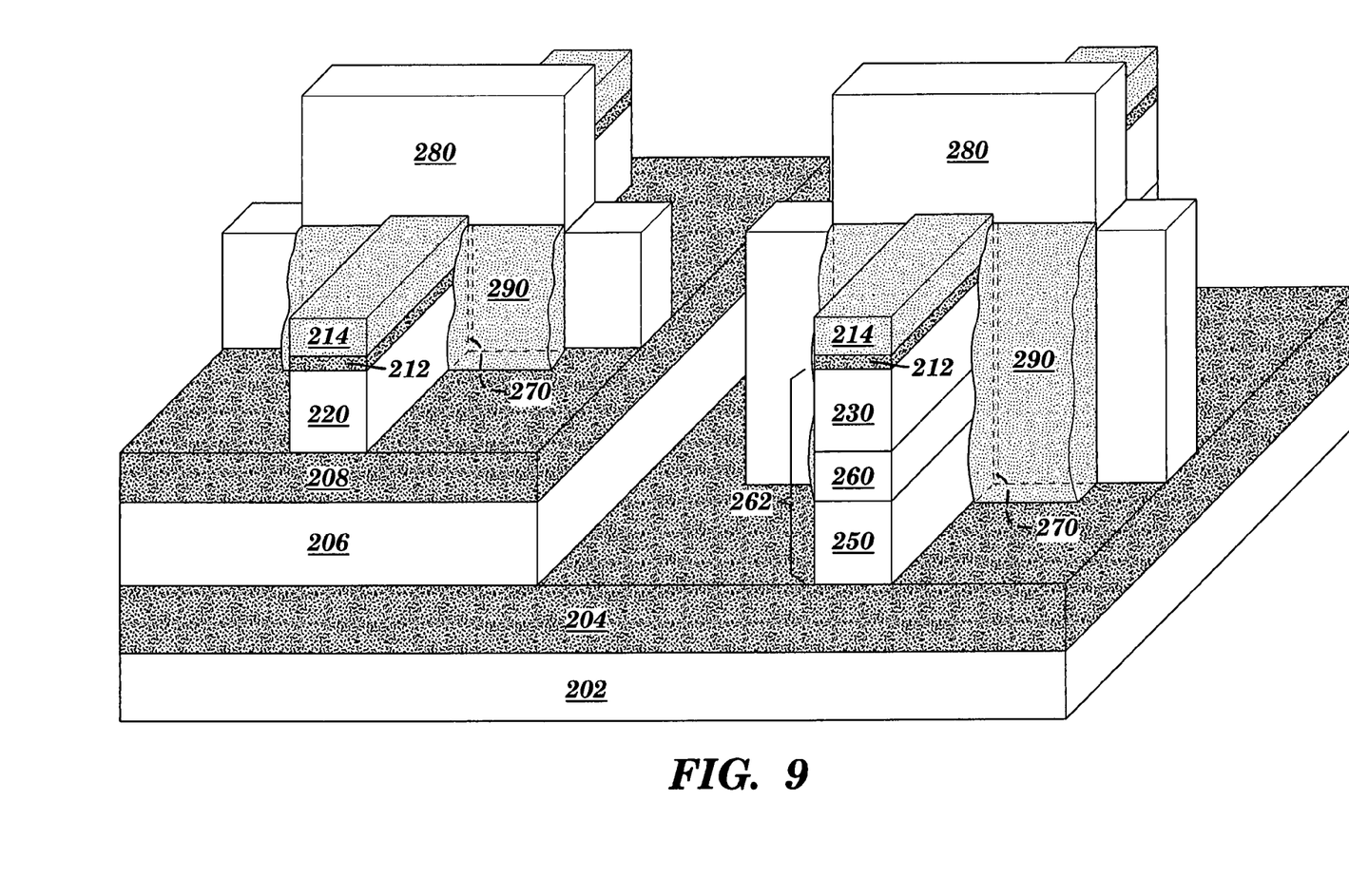

Turning now to FIG. 9, exemplary completed finFET devices are illustrated on wafer portion 202. An embodiment of the present invention is depicted having a minimum of complexity. Gate stacks comprise gate insulator layers 270, which are formed on opposing sides of first fins 220 and also on opposing sides of second fins 230 and third fins 250 of stacked double fins 262, and gate conductor layers 280, which overly gate insulator layers 270, hardmask film 212 and hardmask cap layers 214. Oxide spacers 290 are formed on the sidewalls of gate conductor layers 280. The finFET channel region is that portion of the opposing fin sidewalls between the source and drain regions of the respective finFET devices. Also in this particular embodiment, gate conductor layers 280 are continuous across both sides of the fin, but in other embodiments, the gate conductor layers are divided into two portions.

CMOS finFET devices according to the present invention may be used in many different kinds of circuits, such as high performance logic, low power logic or high density memory devices, including high density multi-gigabit DRAMs. Moreover, the CMOS finFET devices may readily be combined with other elements, such as for example capacitors, resistors, diodes, memory cells and so forth.

The present invention thus provides a device structure and method for forming finFETs that overcome many of the disadvantages of the prior art. Specifically, the device structure and method provide the ability to form finFET devices with improved circuit density while accounting for mobility differences by forming a finFET device with a single fin n-finFET and a stacked double fin p-finFET. Additionally, the device structure and method provide the ability to form finFET devices that utilize various crystal planes in order to optimize mobility and/or reduce mobility in specific devices. Finally the device structure and method provide improved fin height control by forming finFETs from multiple silicon layers having buried oxide layers in between the silicon layers, the buried oxide layers acting as a silicon etch stop.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims. Accordingly, unless otherwise specified, any components of the present invention indicated in the drawings or herein are given as an example of possible components and not as a limitation. Similarly, unless otherwise specified, any steps or sequence of steps of the method of the present invention indicated herein are given as examples of possible steps or sequence of steps and not as limitations.

The invention claimed is:

1. A semiconductor structure, comprising:
   a semiconductor substrate having a first semiconductor layer positioned on a first insulator layer, a second insulator layer positioned on said first semiconductor layer, and a second semiconductor layer positioned on said second insulator layer;
   a first and second fin formed in said second semiconductor layer; and
   a third fin formed in said first semiconductor layer, wherein said second fin is stacked on said third fin,
   and wherein said first semiconductor layer has a surface oriented on a first crystal plane and said second semiconductor layer has a surface oriented on a second crystal plane, said first crystal plane being oriented differently than said second crystal plane, and wherein said surface oriented on said first crystal plane is substantially parallel to said surface oriented on said second crystal plane.

2. The semiconductor structure of claim 1, wherein said stacked fins form a first finFET and said first fin forms a second finFET.

3. The semiconductor structure of claim 2, wherein said first finFET is a p-channel finFET and said second finFET is a n-channel finFET.

4. The semiconductor structure of claim 1, wherein said second semiconductor layer is bonded to said second insulator layer.

5. The semiconductor structure of claim 1, wherein a height of said third fin corresponds to a thickness of said first semiconductor layer.

6. The semiconductor structure of claim 5, wherein said first semiconductor layer thickness ranges approximately from 40 nm to 70 nm.

7. The semiconductor structure of claim 1, wherein a height of said first fin and said second fin correspond to a thickness of said second semiconductor layer.

8. The semiconductor structure of claim 7, wherein said second semiconductor layer thickness ranges approximately from 40 nm to 70 nm.

9. The semiconductor structure of claim 1, wherein a first mobility is associated with said first crystal plane and a second mobility is associated with said second crystal plane, wherein said first mobility is different from said second mobility.

10. The semiconductor structure of claim 1, wherein sidewalls of said first and second fins are orientated on a {100} crystal plane and sidewalls of said third fin are oriented on a {110} crystal plane.

11. The semiconductor structure of claim 1, further comprising:
    a dopant implanted into each of said fins;
    a gate insulator layer formed on opposing sidewalls of each of said fins;
    a gate conductor layer formed on said gate insulator layer, wherein said gate conductor layer and said gate insulator layer form gate stacks;
    a source region implanted in a first exposed portion of each of said fins; and
    a drain region implanted in a second exposed portion of each of said fins, wherein said source and drain regions are separated by a channel region.

* * * * *